United States Patent [19]

Graser et al.

[11] 4,156,757
[45] May 29, 1979

[54] ELECTRICALLY CONDUCTIVE PERYLENE DERIVATIVES

[75] Inventors: Fritz Graser, Ludwigshafen; Herbert Naarmann, Wattenheim, both of Fed. Rep. of Germany

[73] Assignee: BASF Aktiengesellschaft, Fed. Rep. of Germany

[21] Appl. No.: 821,551

[22] Filed: Aug. 3, 1977

[30] Foreign Application Priority Data

Aug. 13, 1976 [DE] Fed. Rep. of Germany ....... 2636421

[51] Int. Cl.² ........................................... H01C 31/00
[52] U.S. Cl. .................................. 428/411; 252/501; 252/500; 546/29; 546/27; 546/26
[58] Field of Search .................... 252/500, 501; 96/1.5; 260/282, 281; 428/411

[56] References Cited

U.S. PATENT DOCUMENTS

| | | | |
|---|---|---|---|
| 2,998,402 | 8/1961 | Geiger et al. ...................... | 260/282 X |
| 3,862,094 | 1/1975 | Shinohara et al. ............... | 252/500 X |
| 3,871,882 | 3/1975 | Wiedemann ...................... | 252/501 X |
| 4,018,602 | 4/1977 | Chu ................................... | 252/500 X |

Primary Examiner—Benjamin R. Padgett
Assistant Examiner—E. Suzanne Parr
Attorney, Agent, or Firm—Keil & Witherspoon

[57] ABSTRACT

Electrically conductive organic perylene derivatives and their use. They have the formulae

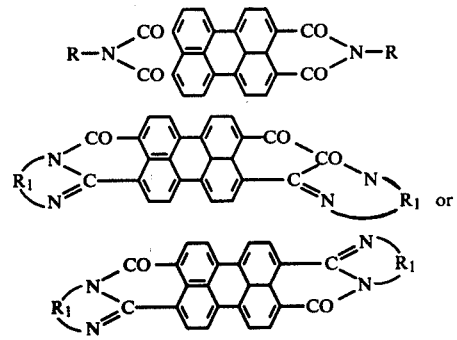

where R is hydrogen, alkyl or oxaalkyl of 1 to 10 carbon atoms, cycloalkyl, alkaryl or aryl which is unsubstituted or substituted by from 1 to 3 alkoxy, halogen, nitro or amino, or is hydroxyalkyl-$CH_2$-$(CH_2)_n$-OH, where n is an integer from 1 to 10, and which may or may not contain oxa groups, and $R_1$ is one of the following divalent radicals which join the two N atoms to form a ring:

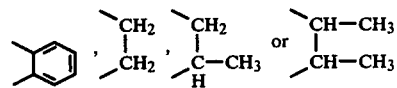

The compounds may be used for the manufacture of electrically conductive systems and of semiconductors.

4 Claims, No Drawings

ELECTRICALLY CONDUCTIVE PERYLENE DERIVATIVES

The present invention relates to the use of perylene derivatives for the manufacture of electrically conductive systems and semiconductors.

The use of polyphenylenes of rod-shaped configuration as polymeric organic semi-conductors has been disclosed (Naturwissenschaften 56 (1969), 308). The use of special polycation charge transfer complexes of the type of TCNQ (tetracyanoquinonedimethane) has also been disclosed (Chem. and Ind. 17th Jan. 70).

It is an object of the present invention to provide a new category of compounds which can be used for the manufacture of electrically conductive, especially photoconductive, systems and for the manufacture of semiconductors.

We have found that this object is achieved by using organic perylene derivatives of the formulae I and/or II

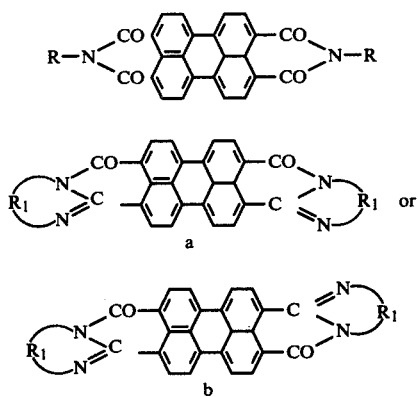

where R is hydrogen, alkyl or oxaalkyl of 1 to 10 carbon atoms, cycloalkyl, alkaryl or aryl wich is unsubstituted or substituted by from 1 to 3 alkoxy, halogen, nitro or amino, or is hydroxyalkyl of the formula $H_2\text{-}(CH_2)_n\text{-}OH$, where n is an integer from 1 to 10, which hydroxyalkyl may or may not contain oxa groups, and $R_1$ is one of the following divalent radicals which join the two N atoms to form a ring:

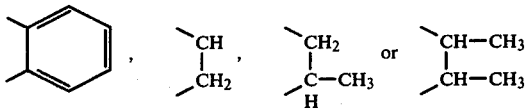

for the manufacture of electrically conductive systems and semiconductors.

The organic low-molecular weight compounds defined in accordance with the invention exhibit excellent electrical conductivity and thus provide the possibility of employing these systems for solar cells.

This behavior is all the more surprising since hitherto good conductivity appeared to be dependent on polyconjugation of $\pi$-bonds or on the presence of S or Se hetero-atoms in heterocyclic compounds, eg. in tetrathiofulvalene (literature: Leiter und Supraleiter aus polymeren (German edition), E. P. Goodings, Endeavour, September 1975).

In general, the compounds to be used according to the invention are advantageously manufactured by cyclizing the perylenetetracarboxylic acids by means of amines to give the imide of the structure I or the imidazoles of the structure II.

Suitable amines to be used as components for synthesizing the perylene derivatives of the formula I are ammonia, alkylamines with linear or branched alkyl of 1 to 10 carbon atoms, and corresponding oxaalkylamines, eg. ethylamine, propylamine, isopropylamine, butylamine, 2-methylbutylamine, 1-amino-3-methoxypropane, 1-amino-3-ethoxypropane and 1-amino-2-methoxyethane, cycloalkylamines, eg. cyclohexylamine, alkaraylamines, preferably phenalkylamines, eg. $\beta$-phenylethylamine and phenylisopropenylamine, arylamines, eg. aniline, arylamines substituted by from 1 to 3 alkoxy, halogen, nitro or amino, especially the corresponding aniline derivatives, eg. anisidine, o-, m- and p-chloroaniline, m- and p-nitroaniline, m- and p-phenylenediamine and p-dimethylaminoaniline, and hydroxyalkylamines of the formula $H_2N\text{—}CH_2\text{—}(CH_2)_n\text{—}OH$, where n is an integer from 1 to 10, which may or may not contain oxa groups.

Examples of suitable diamines for the manufacture of the perylene derivatives having an imidazole ring, as shown in formula II, are o-phenylenediamine, ethylenediamine, propylene-1,2-diamine and butylene-1,2-diamine.

The reaction conditions for the manufacture of the perylene derivatives of the formula I or II correspond to those which are employed to manufacture imides from perylene-3,4,9,10-tetracarboxylic acid or its anhydride and primary amines, or for the manufacture of the corresponding imidazoles from perylene-3,4,9,10-tetracarboxylic acid and diamines, and which are described, for example, in German Patent Nos. 2,451,780, 2,451,781 and 2,451,783, German Laid-Open Applications DOS 2,451,784 and DOS 2,451,782 and Belgian Patent 580,343.

The perylene derivatives to be used according to the invention are in general obtained in the form of amorphous red to dark red virtually insoluble pigments which are freed from soluble organic and/or inorganic impurities by careful washing and milling.

By dissolving the derivatives and recrystallizing them from concentrated sulfuric acid or aluminum bromide melts it proves possible to obtain crystals which exhibit a high gloss and high reflectance.

According to the invention, the perylene derivatives of the formula I and/or II are used for the manufacture of electrically conductive systems, i.e. a layered photoconductor or semiconductor article of manufacture in which the electrically conductive layer consists essentially of an organic perylene derivative, preferably a peryleneimidazole of the formula IIa or b above. By these layered photoconductors or semiconductors, there are understood in particular semiconductor systems for the electronics sector and photovoltage systems for solar cells. To manufacture such electrically conductive systems, it is advantageous to follow the general principles described for inorganic materials.

The electrical dark conductivity of the perylene derivatives to be used according to the invention was measured in a cell like that described in Ber. der Bunsengesellschaft fur physikal. Chemie, 68 (1964), No. 6, 559, whilst the electrical photoconductivity was measured in a cell corresponding to that described in ibid., 560. The electrical conductivity data are given throughout in Siemens/cm [S/cm], measured at 25° C.

In addition, for several of the compounds to be used according to the invention the electrical conductivities of their complexes with TCNQ (=tetracyanoquinonedimethane) in the molar ratio of 1:1 are also shown.

| No. | Modification | Formula I: R = | S/cm conductivity | S/cm conductivity as the TCNQ complex | Δ Difference in conductivity |
|---|---|---|---|---|---|
| 1 | amorphous | H | $4.8 \times 10^{-4}$ | $3.5 \times 10^{-3}$ | $+1.3 \times 10^{1}$ |
| 2 | amorphous | $-CH_2-CH_3$ | $6.1 \times 10^{-8}$ | $1.5 \times 10^{-2}$ | |
| 3 | crystals | $-CH-(CH_3)_2$ | $1.2 \times 10^{-8}$ | $2.6 \times 10^{-5}$ | |
| 4 | crystals | $-(CH_2)_2 CH_3$ | $3.1 \times 10^{-5}$ | $4.2 \times 10^{-2}$ | |
| 5 | amorphous | $-(CH_2)_2-CH_3$ | $4.9 \times 10^{-5}$ | $5.6 \times 10^{-4}$ | $+0.7 \times 10^{1}$ |
| 6 | crystals | $-CH_2-CH(CH_3)-C_2H_5$ | $2.9 \times 10^{-5}$ | $7.0 \times 10^{-2}$ | |
| 7 | amorphous | $-CH_2-CH_2-O\,CH_3$ | $8.2 \times 10^{-6}$ | $9.0 \times 10^{-3}$ | |
| 8 | crystals | $-(CH_2)_3-O\,CH_3$ | $1.3 \times 10^{-4}$ | $5.9 \times 10^{-2}$ | |
| 9 | amorphous | $-(CH_2)_3-O\,CH_3$ | $7.2 \times 10^{-5}$ | $3.8 \times 10^{-2}$ | $+6.6 \times 10^{2}$ |
| 10 | crystals | $-(CH_2)_3-O\,C_2H_5$ | $5.7 \times 10^{-5}$ | $7.8 \times 10^{-2}$ | |
| 11 | amorphous | $-(CH_2)_3-O\,C_2H_5$ | $1.3 \times 10^{-4}$ | $4.2 \times 10^{-3}$ | $+2.9 \times 10^{1}$ |
| 12 | amorphpus | —C₆H₅ (phenyl) | $1.3 \times 10^{-5}$ | | |
| 13 | amorphous | —C₆H₄—Cl (para) | $1.5 \times 10^{-3}$ | | |
| 14 | amorphous | —C₆H₄—Cl (meta) | $2.7 \times 10^{-4}$ | | |
| 15 | amorphous | —C₆H₄—Cl (ortho) | $6.7 \times 10^{-5}$ | | |
| 16 | amorphous | —C₆H₄—NO₂ (para) | $1.2 \times 10^{-6}$ | | |
| 17 | amorphous | —C₆H₄—NO₂ (meta) | $3.5 \times 10^{-7}$ | | |
| 18 | amorphous | —C₆H₄—NH₂ (para) | $1.2 \times 10^{-6}$ | | |
| 19 | amorphous | —C₆H₄—NH₂ (meta) | $4.3 \times 10^{-7}$ | | |
| 20 | amorphous | —C₆H₄—N(CH₃)₂ | $4.0 \times 10^{-5}$ | $1.1 \times 10^{-4}$ | $+0.7$ |
| 21 | crystals | $-CH_2-CH_2-C_6H_5$ | $8.7 \times 10^{-8}$ | $1.3 \times 10^{-4}$ | |
| 22 | amorphous | $-CH_2-CH_2-C_6H_5$ | $2.4 \times 10^{-3}$ | $1.3 \times 10^{-3}$ | $+0.9 \times 10^{1}$ |

| No. | Modification | Formula I: R = | S/cm conductivity | S/cm conductivity as the TCNQ complex | Δ Difference in conductivity |
|---|---|---|---|---|---|
| 23 | crystals | —CH₂—CH(CH₃)—C₆H₅ | 1.0 × 10⁻⁷ | 8.3 × 10⁻⁴ | |
| 24 | amorphous | —CH₂—CH(CH₃)—C₆H₅ | 1.2 × 10⁻⁵ | 5.2 × 10⁻² | + 4.0 × 10³ |

| No. | Modification | Formula II: R₁ = | S/cm conductivity |
|---|---|---|---|
| 25 | amorphous | H₂C—, H₂C— | 8.7 × 10⁻² |
| 26 | amorphous | H₂C—, H₃C—CH— | 9.5 × 10⁻⁶ |
| 27 | amorphous | H₃C—CH—, H₃C—CH— | 2.6 × 10⁻⁸ |
| 28 | amorphous | (o-xylyl) | 1.9 × 10⁻⁶ |

We claim:

1. A layered photoconductor or semiconductor having an electrically conductive layer consisting essentially of an organic peryleneimidazole of the formula

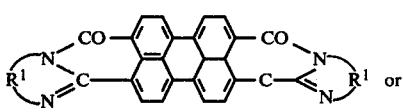

a or

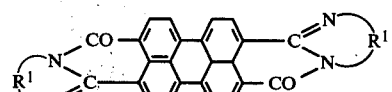

b wherein R¹ is one of the following divalent radicals which join the two N atoms to form a ring:

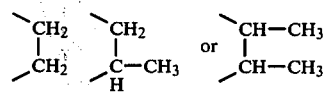

2. A photoconductor or semiconductor as claimed in claim 1 wherein R₁ is

3. A photoconductor or semiconductor as claimed in claim 1 wherein R₁ is

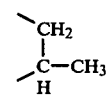

4. A photoconductor or semiconductor as claimed in claim 1 wherein R₁ is

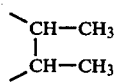

* * * * *

UNITED STATES PATENT AND TRADEMARK OFFICE
CERTIFICATE OF CORRECTION

PATENT NO. : 4,156,757
DATED : May 29, 1979
INVENTOR(S) : GRASER ET AL

It is certified that error appears in the above—identified patent and that said Letters Patent is hereby corrected as shown below:

IN THE ABSTRACT:

The latter part of the second formula is incorrect, and should read as follows:

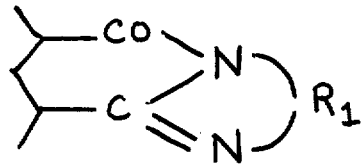

Signed and Sealed this

Fifteenth Day of April 1980

[SEAL]

Attest:

SIDNEY A. DIAMOND

Attesting Officer      Commissioner of Patents and Trademarks